(12) United States Patent
Shih et al.

(10) Patent No.: US 7,208,756 B2
(45) Date of Patent: Apr. 24, 2007

(54) ORGANIC SEMICONDUCTOR DEVICES HAVING LOW CONTACT RESISTANCE

(76) Inventors: Ishiang Shih, 7905 Rosland St., Brossard, Quebec (CA) J4X 2R6; Yi Chen, 6320 Bienville St., Brossard, Quebec (CA) J4Z 1X3; Chunong Qiu, 3590 Rue Ovide, Brossard, Quebec (CA) J4Y 2N2; Cindy X. Qiu, 6215 Bienville St., Brossard, Quebec (CA) J4Z 1W6; Steven Shuyong Xiao, 514B St-Luc St., Laval, Quebec (CA) H7N 4Y3

( * ) Notice: Subject to any disclaimer, the term of this patent is extended or adjusted under 35 U.S.C. 154(b) by 0 days.

(21) Appl. No.: 10/914,676

(22) Filed: Aug. 10, 2004

(65) Prior Publication Data
US 2006/0033098 A1    Feb. 16, 2006

(51) Int. Cl.
*H01L 29/08* (2006.01)

(52) U.S. Cl. .......... 257/40; 257/E51.006; 257/E51.019

(58) Field of Classification Search .................. 257/40, 257/E51.006, E51.019
See application file for complete search history.

(56) References Cited

U.S. PATENT DOCUMENTS

| | | | |
|---|---|---|---|
| 5,107,308 A * | 4/1992 | Koezuka et al. ............... 257/40 |
| 5,596,208 A * | 1/1997 | Dodabalapur et al. ......... 257/66 |
| 6,569,707 B2 * | 5/2003 | Dimitrakopoulos et al. .. 438/99 |
| 6,992,324 B2 * | 1/2006 | Nagayama .................... 257/40 |
| 7,081,641 B2 * | 7/2006 | Kawasaki et al. ............. 257/40 |
| 7,105,854 B2 * | 9/2006 | Sirringhaus et al. ........... 257/40 |
| 2003/0226996 A1 * | 12/2003 | Aramaki et al. ....... 252/62.3 Q |
| 2005/0167703 A1 * | 8/2005 | Klauk et al. ................. 257/225 |

* cited by examiner

*Primary Examiner*—Sara Crane

(57) ABSTRACT

Organic semiconductor-based devices such as thin film transistors, organic light emitting devices and solar cells have potential in low cost electronic and optoelectronic applications. The performance of these organic semiconductor-based devices is often limited by the large resistance between the organic semiconductors and counter electrodes. This invention provides device structures and methods to reduce the unwanted resistance.

16 Claims, 9 Drawing Sheets

ORGANIC SEMICONDUCTOR DEVICES HAVING LOW CONTACT RESISTANCE

FIELD OF THE INVENTION

This invention relates to organic semiconductor devices for electronic and optoelectronic application. More specifically, it relates to methods to reduce contact resistance between an organic semiconductor and counter electrode in an organic-based device.

BACKGROUND OF THE INVENTION

Organic compound materials containing carbon, hydrogen and oxygen used to be considered as insulators and have been extensively used as passive protective layers (e.g. photoresist) for a long time. The discovery of semiconducting organic materials in 1978 marked the birth of a new field "organic electronics" and "organic optoelectronics". Organic materials, primarily consisting of carbon, oxygen, hydrogen and nitrogen, can be classified into three different groups: monomers (small molecules), polymers and biological molecules according to their molecular weights.

Monomers, the simplest and lightest structures, are individual units consisting of typically 30 or 40 covalently bonded carbon, nitrogen, oxygen and hydrogen atoms. They can sometimes contain metal atoms (e.g. Al, Pt, Cu), which provide some unique optical or electronic properties. Polymers, are usually formed by stringing together monomers in continuous, repeating chains and their molecular weight can be much higher than monomers (several thousands). While forming polymers, these chains can fold and cross in a random manner, which unavoidably cause high density of defects, resulting in much lower mobilities than monomers. Small molecules are organic materials with intermediate molecular weight between monomers and polymers. Usually an organic material with a molecular weight less than 1000 is called small molecule, and is called polymer beyond this value.

Various electronic and optoelectronic devices have been developed using small molecules organic semiconductors or polymers. Some examples are: organic light emitting devices (OLEDs), organic thin film transistors (OTFTs) and organic solar cells. Compared to devices and circuits fabricated using inorganic semiconductors such as silicon (Si) or gallium arsenide (GaAs), the organic devices and circuits have some advantages such as: low fabrication cost, large substrate area and flexibility. Possible applications of the organic devices include: light sources, electronic displays, circuits, photovoltaic energy conversion and optical signal detection.

There are several requirements for the semiconductor materials, either organic or inorganic, for use in electronic and optoelectronic devices: controlled carrier concentration, large carrier mobility, controlled lifetime and thermal stability. Among these, the carrier mobility has strong effects in affecting the performance and efficiency of the devices fabricated. For most of the device applications, it is preferable to have the carrier mobility as large as possible.

In general, the carrier mobilities for many of the organic semiconductors being developed are quite small (in the range from $10^{-7}$ to 1 $cm^2/V$-s) due to the structural nature of these materials. For devices constructed using the organic semiconductors with small carrier mobilities, the performance required for applications may not be easily achieved. This is particularly true when parasitic components are present in these devices which can lead to further degradation of the performance. The above-described parasitic components include unwanted resistance components in these devices. One of these is the contact resistance associated with the interface between an organic semiconductor and a counter electrode. When an organic semiconductor is making contact to a counter electrode, there is a contact resistance. This contact resistance is part of the total series resistance (R) of the device which may limit the operation speeds due to charging and discharging of the capacitor (C) associated with this device. Hence, to achieve better performance, it is desirable to have the product of RC to be as small as possible. One practical way to achieve this is through the reduction of value of R since the value of C is determined by the area of the device and may not be reduced without sacrificing the device performance. Another unwanted effect of having a too large a series resistance is the heat loss due to joule heating. If the resistance of contact between the organic semiconductor and the counter electrode is large, significant amount of joule heating will occur at the contact when a current is applied during the operation. This unwanted joule heating may lead to degradation of the device performance.

Some examples of small molecular organic materials include: pentacence, NPB, AlQ3, CuPc, TPD, Irppy, Some examples of polymeric organic semiconductors include: MEH-PPV (Poly[2-methoxy-5-(2'-ethyl-hexyloxy)-1,4-phenylene vinylene]), poly[3-hexylthiophene-2.5diy](P3HT), poly[3-octylthiophene](P3OT), poly[(4-butylphenyl)-diphenyl-amine-4,4-yl] (poly-TPD), and poly[3,3"-didodecyl-2, 2':5',2"-terthiophene] (PDDTT). The above exemplary organic semiconductors may be adopted for the fabrication of organic semiconductor devices and circuits. To simplify the explanation, the subsequent description will be made using the organic semiconductors MEH-PPV and P3HT. It is noted that MEH-PPV is an organic semiconductor which emits red light when used in an electroluminescence device whereas P3HT is an organic semiconductor which can serve as an active channel layer when incorporated in a thin film transistor.

In an ideal organic semiconductor device, the resistance between the organic semiconductor and the counter electrode should be as small as possible. However, in many organic semiconductor devices the resistance between the organic semiconductors and contact electrodes are as high as $10^{10}$ ohms. This high contact resistance often limits the magnitude of current which is allowed to flow through the organic semiconductors and hence the electronic and optoelectronic performance. The large contact resistances between the organic semiconductors and counter electrodes are mainly due to the relatively large bandgap (~2.0 eV) and high ionization energy (~5.0 eV) of the organic materials, which results in Schottky barriers with various metals or inorganic semiconductors. To circumvent this problem, high work function metals such as Au are often used as source/drain contacts in organic thin film transistors (OTFTs). Ideally, the Schottky barriers formed between a clean Au electrode and MEH-PPV or P3HT should be smaller than 0.2 eV, which should not introduce a large contact resistance. However, in practical fabrication, contact resistances over a large range of values have been observed possibly due to the surface states at the Au-P3HT interface. These surface states may vary significantly with different surface preparing methods and may not be easily reproduced during the fabrication.

From the above comments, it is clear that the resistance associated with the organic semiconductor and counter electrode should be as small as possible in order to improve the device performance. However, due to the low carrier mobility and high electrical resistance, it is often difficult to reduce the contact resistance between an organic semiconductor and its counter electrode.

OBJECTIVE OF THE INVENTION

One objective of this invention is to describe a structure for organic semiconductor in order to reduce contact resistance with contact electrode. Another objective is to provide a method to increase mobility in a thin film transistor. Yet another objective of this invention is to provide an interfacial layer containing $FeCl_3$ for the reduction of contact resistance in organic devices.

DETAILED DESCRIPTION OF THE PREFERRED EMBODIMENTS

Figure 1:
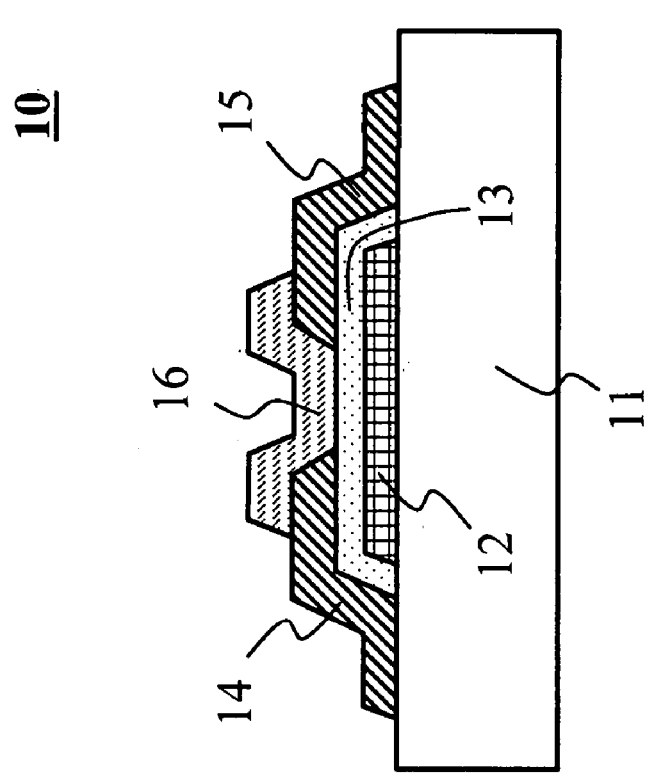
FIG. 1 shows a schematic cross-sectional view of a TFT with bottom electrode structure.

In order to simplify the explanation of the preferred embodiments of this invention, the description will be made in reference to a prior art organic thin film transistor (OTFT, (10)) with a bottom gate structure as shown in FIG. 1. The OTFT (10) consists of a substrate (11), a gate electrode (12), a gate dielectric layer (13), a source electrode (14), a drain electrode (15), and an active channel layer (16). The active channel layer (14) is an organic semiconductor layer deposited between the source electrode and drain electrode. For conventionally fabricated OTFTs, the contact resistance between the active channel layer (16) and the source electrode (14) is large due to the presence of a potential barrier formed between the two. This contact resistance remains to be large even with the application of a voltage to the gate electrode (12). Similarly, the contact resistance between the active channel layer (16) and the drain electrode (15) is large due to the presence of a potential barrier formed between the two. Hence, the resistance between the drain electrode and source electrode is very large even when charges are induced in the active channel layer (16). Due to the large contact resistance between the active channel layer (16) and the source electrode (14), the drain current will be small even with a large voltage applied between the drain electrode (15) and the source electrode (14) (often called drain voltage). The electrical performance of such OTFTs with the large contact resistance is poor and is not suitable for applications in switching circuits or amplifiers.

Figure 2:
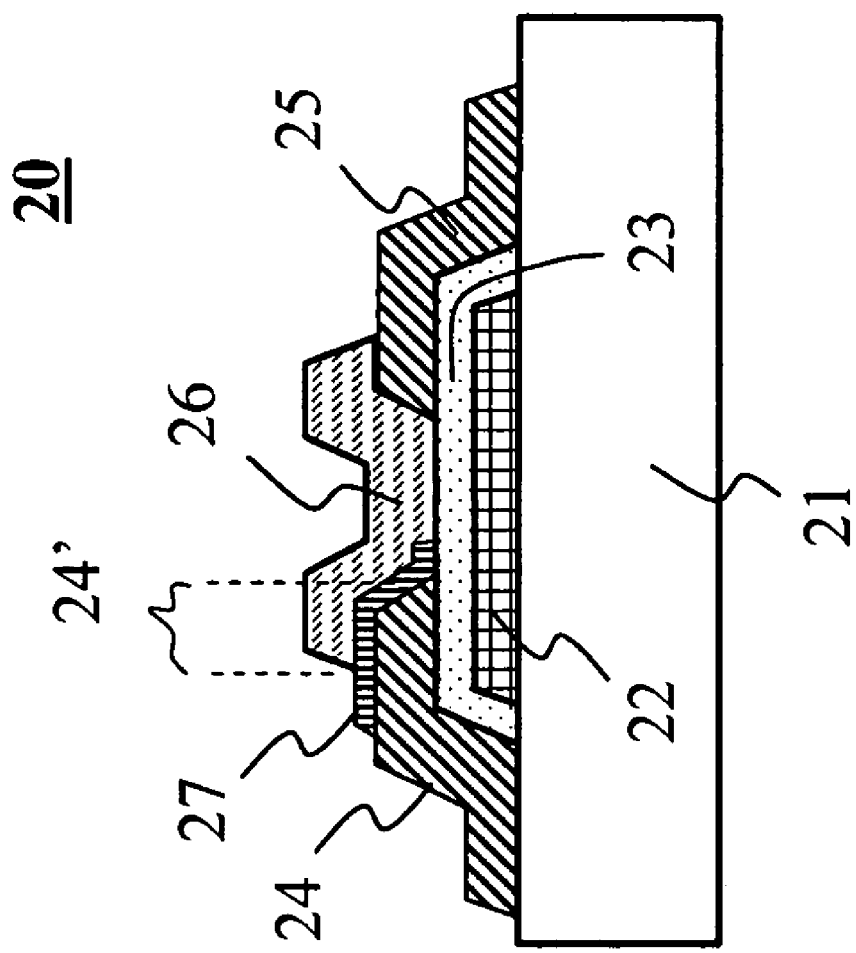
FIG. 2 shows a schematic cross-sectional view of a TFT with a source interfacial layer.

Refer now to FIG. 2 where there is shown a schematic cross-sectional diagram of an OTFT (20) according to one embodiment of this invention. The OTFT (20) consists of a substrate (21), a gate electrode (22), a gate dielectric layer (23) which covers the entire gate electrode (22), a source electrode (24) overlapping a first portion of the gate electrode (22), a drain electrode (25) overlapping a second portion of the gate electrode (22), an active channel layer (26) covering a space between the source electrode (24) and the drain electrode (25) and overlapping a portion of the source electrode (24) and a portion of the drain electrode (25) and a source interfacial layer (27). The source interfacial layer (27) may cover the entire source contact area (24') which is defined by the overlapping region between the source electrode (24) and active channel layer (26). Alternately, the source interfacial layer (27) may cover only a portion the source contact area (24') as long as the contact resistance is reduced to the desired value. The substrate (21) could be a glass plate or a plastic sheet whereas the gate electrode (22) could be a thin layer of conductive metal or metal oxide such as zinc oxide or indium tin oxide. The gate dielectric layer (23) could be silicon oxide, silicon nitride, aluminum oxide, tantalum oxide or their mixtures. The source electrode (24) and drain electrode (25) could be conductive metal such as Al, Cu or Au or metal oxide such as zinc oxide or indium tin oxide. The active channel layer (26) could be organic semiconductors of small molecular weights or large molecular weights such as pentacene, P3HT, or MEH-PPV. According to an embodiment of this invention, the source interfacial layer (27) is selected from a group of materials which is capable of reducing the potential barrier height between the source electrode (24) and the active channel layer (26). When the potential barrier between the source electrode (24) and the active channel layer (26) is reduced by the presence of the source interfacial layer (27), larger electrical current will be allowed to flow from the source electrode (24) to the drain electrode (25) when a voltage (often called drain voltage) is applied between the drain electrode (25) and the source electrode (24). Hence, it become clear according to this invention that the purpose of the source interfacial layer (27) is to reduce the contact resistance between the source electrode (24) and the active channel layer (26). The thickness of the source interfacial layer (27) could be small, in the range from 0.5 nm to 500 nm and more preferably from 1 nm to 100 nm. The actual thickness is selected according to the materials used for the source interfacial layer (27). It should be indicated that although a bottom gate TFT structure is shown in FIG. 2 and in the subsequent description, the present invention achieves the purposes equally well for a top gate TFT, where a gate electrode is deposited on a gate dielectric layer which is further deposited on an active channel layer.

Figure 3:
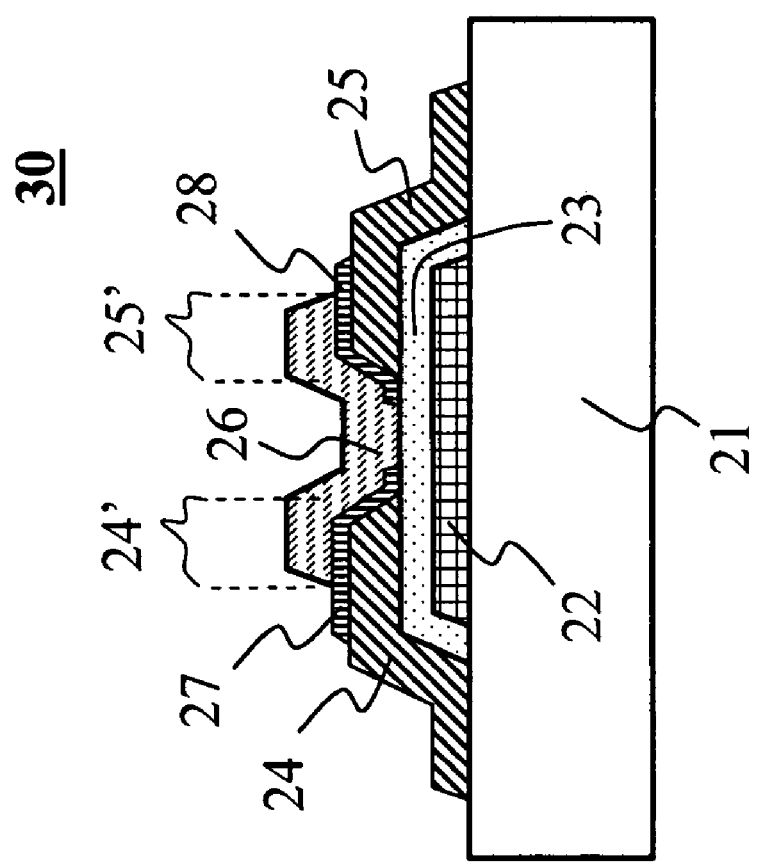
FIG. 3 shows a schematic cross-sectional diagram of a TFT with a source interfacial layer and a drain interfacial layer.

According to another embodiment of this invention, the un-wanted resistance in the OTFTs may be further reduced using the structure as shown in FIG. 3. The OTFT (30) shown in FIG. 3 according to this invention consists of a substrate (21), a gate electrode (22), a gate dielectric layer (23) which covers the gate electrode (22), a source electrode (24) overlapping a first portion of the gate electrode (22), a drain electrode (25) overlapping a second portion of the gate electrode (22), an active channel layer (26) covering a space between the source electrode (24) and the drain electrode (25) and overlapping a portion of the source electrode (24)

and a portion of the drain electrode (25), a source interfacial layer (27) and a drain interfacial layer (28). The source interfacial layer (27) may cover the entire source contact area (24') which is defined by the overlapping region between the source electrode (24) and the active channel layer (26). The drain interfacial layer (28) may cover the entire drain contact area (25') which is defined by the overlapping region between the drain electrode (25) and the active channel layer (26). Alternately, the source interfacial layer (27) may cover at least a portion of the source contact area (24') whereas the drain interfacial layer (28) may cover at least a portion of the drain contact area (25') as long as the contact resistances are reduced to the desired values. In addition to the source interfacial layer (27), the incorporation of the drain interfacial layer (28) can reduce significantly the drain contact resistance and hence the total resistance between the source electrode (24) and the drain electrode (25) of the OTFT (30). According to this embodiment of the invention, the source interfacial layer (27) and the drain interfacial layer (28) are selected from a group of materials which is capable of reducing the potential barrier height between the source electrode (24) and the active channel layer (26) and between the drain electrode (25) and the active channel layer (26). The thicknesses of the source interfacial layer (27) and the drain interfacial layer (28) should be small, in the range from 0.5 nm to 500 nm and more preferably from 1 nm to 100 nm. The actual thicknesses are selected according to the materials used for the source interfacial layer (27) and the drain interfacial layer (28).

Figure 4:
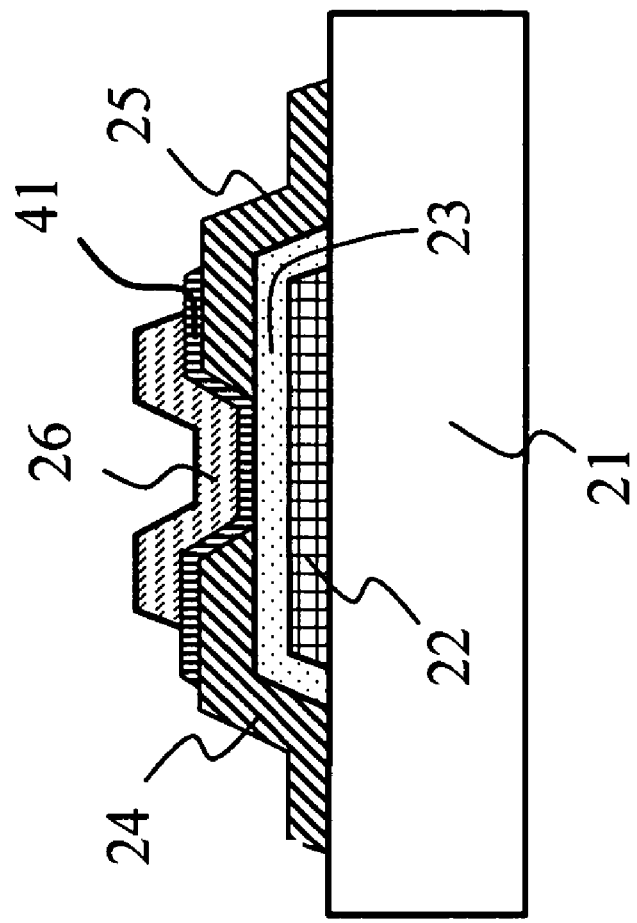
FIG. 4 shows a schematic cross-sectional diagram of a TFT with a partially continuous interfacial layer.

To simplify the fabrication of the OTFTs with reduced source contact resistance and drain contact resistance, an OTFT structure as shown in FIG. 4 could be advantageously adopted. The OTFT (40) shown in FIG. 4 according to yet another embodiment of this invention consists of a substrate (21), a gate electrode (22), a gate dielectric layer (23) which covers the gate electrode (22), a source electrode (24) overlapping a first portion of the gate electrode (22), a drain electrode (25) overlapping a second portion of the gate electrode (22), an active channel layer (26) covering a space between the source electrode (24) and the drain electrode (25) and overlapping a portion of the source electrode (24) and a portion of the drain electrode (25), and a continuous interfacial contact layer (41). Hence, it becomes clear that in the OTFT structure (40) shown in FIG. 4, the continuous interfacial contact layer (41) overlaps only a first portion of the source electrode (24) and a first portion of the drain electrode (25). The second portion of the source electrode (24) and the second portion of the drain electrode (25) are not covered by the continuous interfacial contact layer (41). The continuous interfacial contact layer (41) overlaps a first portion of the drain electrode (25), a first portion of the source electrode (24) and the active channel region defined there between. This continuous interfacial contact layer (41) is selected from a group of materials which is without too large a carrier density and is capable of reducing the potential barriers between the source electrode (24) and the active channel layer (26) and between the drain electrode (25) and the active channel layer (26). Since the carrier density of the continuous interfacial contact layer (41) is small, the presence of the continuous interfacial contact layer (41) beneath the active channel layer (26) will not give rise to a significant increase in the OFF current when a drain voltage is applied between the drain electrode (25) and the source electrode (24). The thickness of the continuous interfacial contact layer (41) should be small, in the range from 0.5 nm to 500 nm and more preferably from 1 nm to 100 nm. The actual thickness is selected according to the materials used for the continuous interfacial contact layer (41).

Figure 5:
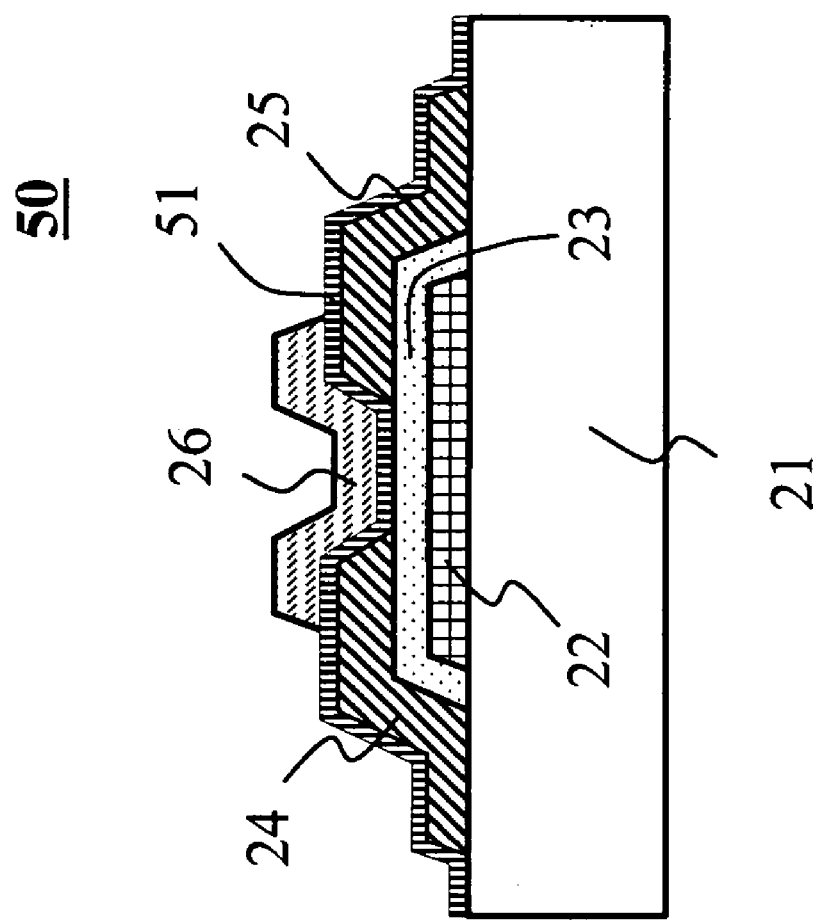
FIG. 5 shows a schematic cross-sectional diagram of a TFT with a fully continuous interfacial layer.

Since the thickness of the continuous interfacial contact layer (41) shown in FIG. 4 is small, the structure may be further simplified by having the continuous interfacial contact layer to cover the entire surface of the OTFT. FIG. 5 shows an OTFT (50) according still another embodiment of this invention. Here all regions and components indicated by the numerals have the same meanings as the ones described in FIG. 4 except for the continuous interfacial contact layer (51), which covers the entire OTFT (50) area including the source electrode (24), drain electrode (25), active channel region and part of the exposed substrate (21). According to this embodiment of the invention, it is not required to remove the materials of the continuous interfacial contact layer (51) from the second portion of the source electrode (24) and the second portion of the drain electrode (25) and therefore simplify the structure and fabrication processes.

Figure 6:
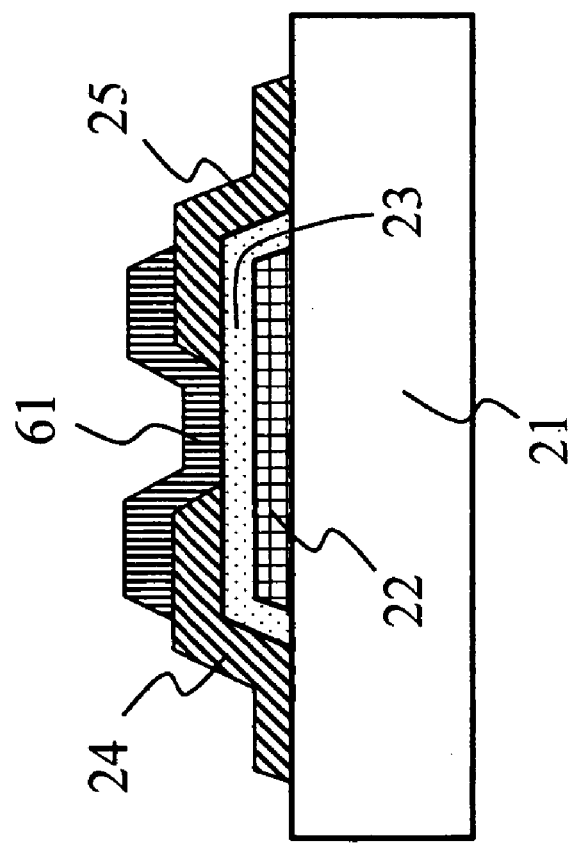
FIG. 6 shows a schematic cross-sectional diagram of a TFT with potential barrier reduction agent added into the active channel layer.

According to still another embodiment of this invention, the potential barrier between the source electrode (24) and active channel layer (61) of an OTFT (60) as shown in FIG. 6 is reduced by adding an agent into the active channel layer (61) in a substantially uniform manner. Materials of this added agent being selected so that they do not increase the carrier density of the active channel layer (61) but cause a decrease in the potential barrier height between the source electrode (24) and the active channel layer (61). Hence, according to this embodiment of the invention, the excessive series resistance between the source electrode (24) and the active channel layer (61) can be reduced. By incorporating the agent into the active channel layer (61), the fabrication processes for the OTFTs and circuits may be simplified.

According to this invention, the material for the interfacial contact layer is preferably selected from a group of organic materials including but not limited to P3HT, MEH-PPV etc. Agents such as $FeCl_3$ are added to these organic materials for use as the source interfacial layer, drain interfacial layer or the continuous interfacial contact layer. Compositions of the interfacial materials are controlled and tuned so that the height of potential barriers formed between the source electrode (24) and the active channel layer (61) is small enough so that the height of this potential barrier can be reduced further by the application of a gate voltage. It is noted that the gate voltage exceeding a threshold value will induce charges in the active channel layer (61). When a voltage is applied to the drain electrode (25), these charges can now flow from the source electrode (24) to the drain electrode (25) forming an output drain current. Specific examples are given below to describe the invention.

EXAMPLE 1

OTFT with an Interfacial Layer Doped with $FeCl_3$

Figure 7:
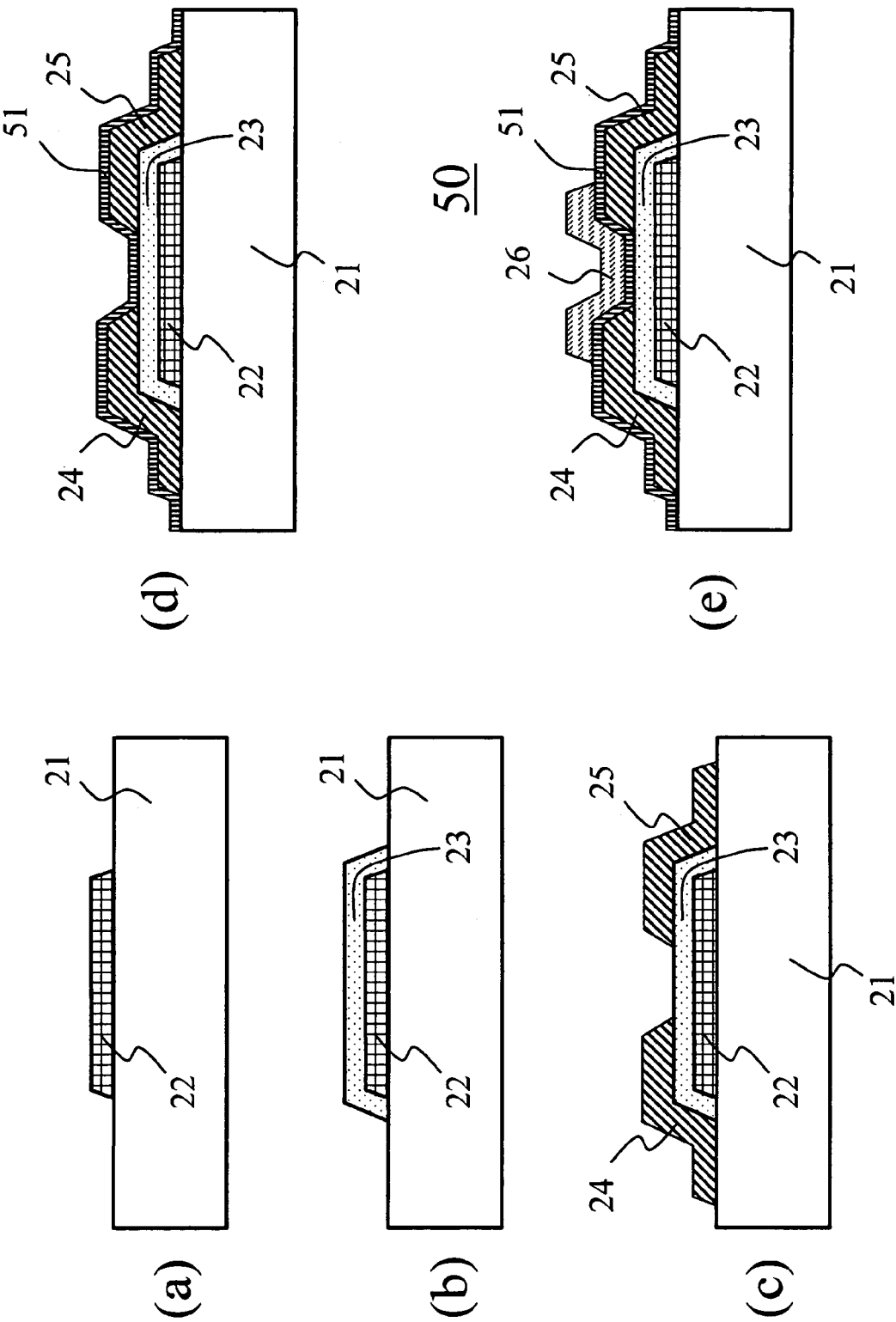
FIG. 7 gives cross-sectional diagrams of a TFT after different stages of the fabrication.

Refer now to FIG. 7(a), a layer of aluminum (Al) with a thickness of 1 μm is deposited on a glass substrate (21) by sputtering or evaporation. Unwanted Al film is etched away by a conventional lithography and etching process to form a gate electrode (22). After the etching, photoresist is stripped and the glass substrate (21) with the etched Al gate electrode (22) is cleaned and baked dry. A thin gate dielectric layer (23) is now deposited on the etched Al gate electrode (22), as seen in FIG. 7(b) by anodization. After the anodization, a gate dielectric layer (23) of $Al_2O_3$ with a thickness of 150 nm is obtained. It is noted that good quality gate dielectric layer (23) may also be created by vacuum deposition methods or chemical vapor deposition methods. The materials of the gate dielectric layer (23) may be silicon oxide, silicon nitride, aluminum oxide or tantalum oxide or any of their combinations. The preferred thickness of the gate dielectric layers (23) is from 100 nm to 200 nm in order to withstand the gate voltage. After the formation of the gate dielectric layer (23), a source electrode (24) and a drain electrode (25), as shown in FIG. 7(c), are created by a vacuum deposition of Au/Ti and defined by a lithography method. After this, a layer of continuous interfacial contact layer (51) is applied onto the substrate with the gate dielectric layer (23), source electrode (24) and drain electrode (25), as shown in FIG. 7(d). The material of this continuous interfacial contact layer (51) is a solution of P3HT (1 wt. %) in chloroform with 200 ppm of $FeCl_3$ and is applied onto the substrate by spinning coating followed by a vacuum drying step. Thickness of the continuous interfacial contact layer (51) is about 20–50 nm. After the application of the continuous interfacial contact layer (51), as shown in FIG. 7(e), a P3HT active channel layer (26) is applied between the drain and source to complete the OTFT (50). Thickness of the P3HT active channel layer (26) is 200 nm. With the presence of the continuous interfacial contact layer (51), the contact resistance between the P3HT active channel layer (26) and Au/Ti source electrode (24) is reduced from $10^{10}$ ohms (without the interfacial layer (51)) to about $10^6$ ohms. Hence, the drain current is increased by 4 orders of magnitude with the deposition of the interfacial contact layer (51). Fabrication of OTFTs having a structure as shown in FIG. 7(e) using the processes depicted above was also performed on MEH-PPV as the active channel layer. After the fabrication, current-voltage characteristics were measured on the OTFTs in order to determine the charge carrier mobilities and the results are summarized in Table 1.

TABLE 1

Characteristics of OTFTs on glass substrates with $Al_2O_3$ as gate dielectrics and different semiconducting polymers as active channel layers.

| OTFTs Based on Different Polymers | MEH-PPV | RR-P3HT |
|---|---|---|
| $\mu_{eff}$ ($cm^2$/V-s) without doping | $4.7 \times 10^{-5}$ | $7.2 \times 10^{-4}$ |
| $\mu_{eff}$ ($cm^2$/V-s) with $FeCl_3$ doping | $6.3 \times 10^{-5}$ | $7.4 \times 10^{-2}$ |

It is seen in Table 1 that the measured field effect mobility $\mu_{eff}$ in MEH-PPV increases by 40% whereas the field effect mobility increases by two orders of magnitude for P3HT with the continuous interfacial contact layer (51) containing $FeCl_3$.

Figure 8:
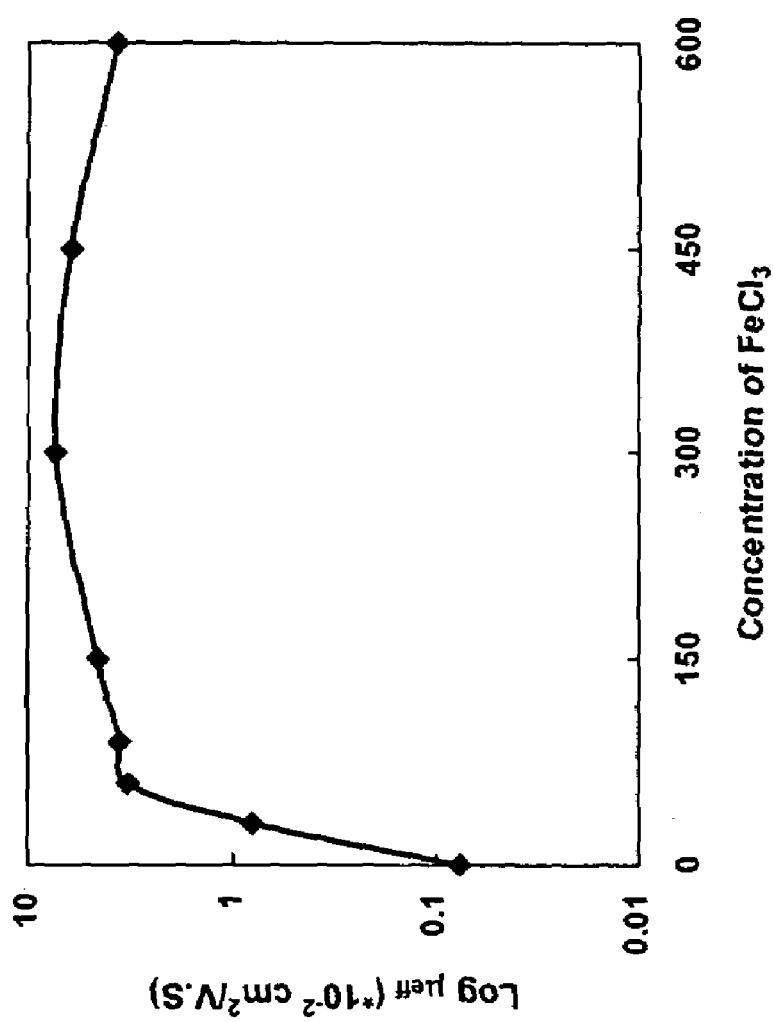
FIG. 8 illustrate the variation of measured field effect mobility of carriers in P3HT with the change in $FeCl_3$ concentration in the interfacial layer.

P3HT OTFTs with continuous interfacial contact layers (51) containing different amounts of $FeCl_3$ were fabricated and studied. The variation of measured field effect mobility in the P3HT OTFTs with the concentration of $FeCl_3$ in the continuous interfacial contact layer (51) is shown in FIG. 8. It is seen that the field effect mobility increases as the $FeCl_3$ concentration is increased. It reaches a maximum at 300 ppm of $FeCl_3$ then decreases with further increase in the $FeCl_3$ concentration.

EXAMPLE 2

Effects of Doping Agents on Contact Resistances

Figure 9:
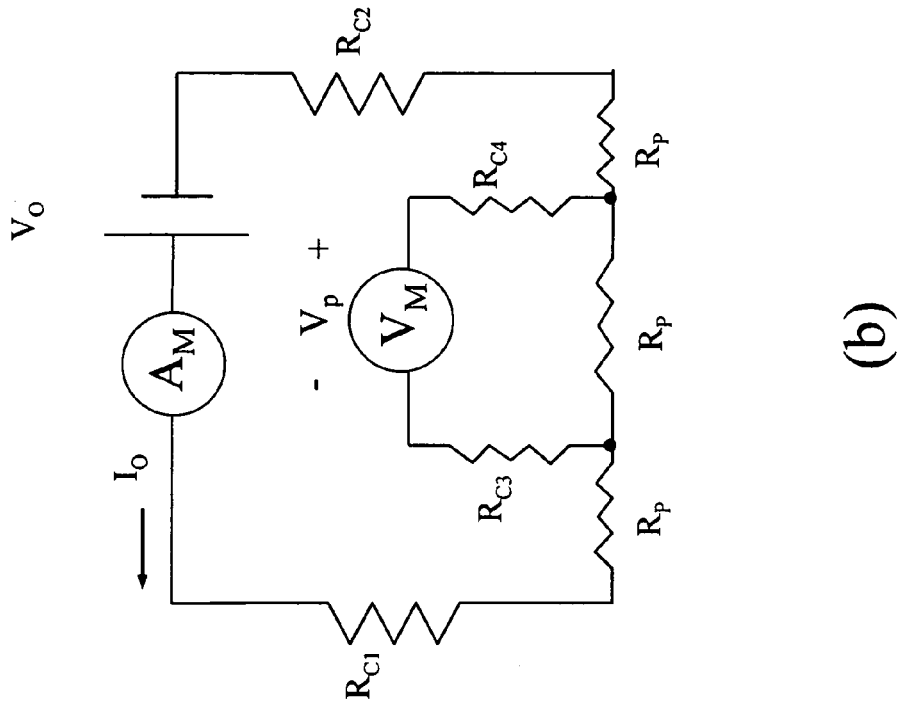
FIG. 9 Four-point probe measurement setup for polymer contact resistance: (a) a schematic diagram of the four Au electrode patterns on a glass substrate; (b) equivalent circuit of the measurement.
Figure 9:
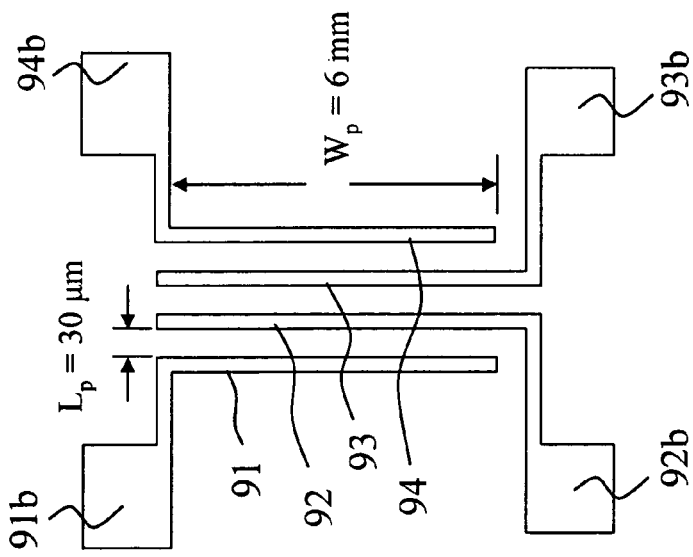

To determine the effects of the $FeCl_3$ in P3HT on contact resistance with counter electrodes, a special test chip (90) as shown schematically in FIG. 9 with four contact strips (91, 92, 93, 94) and four bonding pads (91b, 92b, 93b, 94b) was designed and fabricated. Here, the contact strips (91, 92, 93, 94) are formed by an Au (300 nm)/Ti (100 nm) double layer, each with a length $W_p$ of 6 mm and a spacing $L_p$ of 30 μm between adjacent strips. To determine the contact resistance between the Au/Ti counter electrode and an interfacial layer material, a thin coating of the interfacial layer material is deposited onto the surface of the special test chip (90). Four-probe measurements are then carried out by applying a constant voltage $V_0$ across the two outer bonding pads (91b, 94b) to induce a current $I_0$ and measuring the voltage $V_p$ developed across the two inner bonding pads (92b, 93b). From these four-probe measurements the contact resistance and the resistance of the organic semiconductor thin films in the space between two adjacent contact strips can be determined.

An equivalent circuit of the above-described four-probe measurements showing the components is given in FIG. 9(b). As seen before, a constant voltage ($V_0$) is applied to the two outer contact strips (91, 94) and the potential difference ($V_P$) between the two inner contact strips (92, 93) was measured by a voltmeter ($V_M$) with high input impedance. The current ($I_0$) was determined by an ammeter ($A_M$) connected to the two outer bonding pads (91b, 94b). Therefore, the contact resistance ($R_{C1}$, $R_{C2}$) and polymer resistance ($R_P$) can be determined using the following equations:

$$R_P = \frac{V_P}{I_0} \quad (1)$$

$$R_{C1} + R_{C2} + 3R_P = \frac{V_0}{I_0} \quad (2)$$

Finally, polymer resistivity, $\rho_p$ can be obtained $$\rho_P = \frac{R_P W_P t_P}{L_P} \quad (3)$$

Here, $W_P$ is the length of the metal electrodes and $L_P$ is the distance between two adjacent metal electrodes, which are shown in FIG. 9(a), $t_p$ is the thickness of polymer layers (about 0.2 μm).

Table 2 shows results obtained on the total contact resistance ($R_{C1}+R_{C2}$), resistance of organic semiconductor layer ($R_p$) and the resistivity of the P3HT organic semiconductor $\rho_p$ with the variation of $FeCl_3$ contents. It is clearly seen that the total contact resistance ($R_{C1}+R_{C2}$) decreases by more than five orders of magnitude as the content of $FeCl_3$ is increased from 0 to 600 ppm. Due to the addition of $FeCl_3$, the resistivity of P3HT decreases by a factor of 2. This amount of decrease in resistivity is much smaller as compared to the five orders of magnitude decrease in the total contact resistance. Hence, there is no significant change in the resistivity of P3HT after the addition of $FeCl_3$. From the above results, it is evident that the addition of $FeCl_3$ to the P3HT has resulted in a reduction of the potential barrier height between the P3HT and the Au/Ti contact strips.

Four probe measurements were also carried out on MEH-PPV doped with $FeCl_3$ and the results of total contact resistance ($R_{C1}+R_{C2}$), resistance of organic semiconductor layer ($R_p$) and the resistivity of the MEH-PPV organic semiconductor $\rho_p$ with the variation of $FeCl_3$ contents are shown in Table 3. It is clearly seen that the total contact resistance ($R_{C1}+R_{C2}$) decreases by a factor of 30 as the content of $FeCl_3$ is increased from 0 to 600 ppm. There is no significant change in the resistivity of MEH-PPV after the addition of $FeCl_3$. From the above results, it is also evident that the addition of $FeCl_3$ to the MEH-PPV has resulted in a potential barrier height between the MEH-PPV and the Au/Ti contact strips, although this potential barrier height reduction is not as large as that in P3HT.

TABLE 2

Contact resistances and polymer (P3HT) resistances as a function of $FeCl_3$ doping concentrations.

| Concentration of $FeCl_3$ In P3HT (ppm) | $R_{C1} + R_{C2}$ (MΩ) | $R_p$ (MΩ) | $\rho_p$ (KΩ-cm) |
|---|---|---|---|
| 0 | 300 | 1.0 | 4.0 |
| 150 | 4.7 | 0.79 | 3.2 |
| 300 | 1.0 | 0.57 | 2.3 |
| 450 | 0.07 | 0.57 | 2.3 |
| 600 | 0.001 | 0.48 | 1.9 |

TABLE 3

Contact resistances and polymer (MEH-PPV) resistances as a function of $FeCl_3$ doping concentrations.

| Concentration of $FeCl_3$ In MEH-PPV (ppm) | $R_{C1} + R_{C2}$ (GΩ) | $R_p$ (MΩ) | $\rho_p$ (KΩ-cm) |
|---|---|---|---|
| 0 | 130 | N/A* | N/A* |
| 300 | 30 | 1.0 | 4.0 |
| 450 | 7.5 | 1.0 | 4.0 |
| 600 | 4.2 | 1.0 | 4.0 |

*In the case of undoped MEH-PPV, the contact resistance is much larger than the polymer resistance, so that the voltage drop ($V_P$) caused by polymer resistance is too small to be measured.

The above description has been given using OTFT structures to illustrate the spirit of this invention. However, the adoption of an interfacial layer or the adoption of an agent in the organic semiconductor layer to reduce contact resistance between the organic semiconductor layer and a counter electrode may well be employed to organic semiconductor devices other than OTFTs. These other devices include organic light emitting devices (OLEDs) and organic photovoltaic solar cells. In these devices, the adoption of an interfacial layer between an organic semiconductor and a counter electrode serves to reduce potential barrier forming between the two and to reduce the contact resistance. Hence, the electronic and optoelectronic performance of these OLEDs and organic photovoltaic solar cells can be improved. Finally, it should be indicated that although a bottom gate TFT structure is used in the above description, the present invention achieves the purposes or reducing contact resistance equally well for a top gate TFT, where a gate electrode is deposited on a gate dielectric layer which is further deposited on an active channel layer.

What is claimed is:

1. An organic semiconductor-based thin film transistor with reduced contact resistance comprising:
   a substrate,
   a gate electrode,
   a gate dielectric layer overlapping at least a portion of said gate electrode,
   a drain electrode and a source electrode which are electrically isolated and define a channel region between them, said drain electrode overlaps a first portion of said gate electrode and gate dielectric layer and said source electrode overlaps a second portion of said gate electrode and gate dielectric layer,
   a source interfacial layer overlapping at least a portion of said source electrode, said source electrode with said source interfacial layer overlaps a first portion of said channel region adjacent to a leading edge of said source electrode, and
   an active channel layer deposited on said channel region, said active channel layer overlaps at least a part of said drain electrode and at least a part of said source electrode with said source interfacial layer, forming a source electrode/source interfacial layer/active channel layer sandwiched structure for the reduction of contact resistance between said source electrode and said active channel layer, wherein the potential barrier height between said source electrode and said active channel layer is reduced.

2. An organic thin film transistor with reduced contact resistance as defined in claim 1 wherein said substrate is selected from a group comprising: glass substrates, plastic substrates, semiconductor substrates and metal foils having a substrate dielectric layer.

3. An organic thin film transistor with reduced contact resistance as defined in claim 1 wherein said gate dielectric layer is selected from a group comprising: silicon oxide, silicon nitride, tantalum oxide, aluminum oxide and their mixtures.

4. An organic thin film transistor with reduced contact resistance as defined in claim 1 wherein materials of said active channel layers are selected from a group of small molecule organic semiconductors having molecular weights less than 1000 and large molecule organic semiconductors having molecular weights greater than 1000.

5. An organic thin film transistor with reduced contact resistance as defined in claim 1 wherein materials of said source interfacial layer are selected to be the same organic semiconductor as said active channel layer and said source interfacial layer contains a dopant for the reduction of contact resistance between said source electrode and said active channel layer.

6. An organic thin film transistor with reduced contact resistance as defined in claim 1 further comprising a drain interfacial layer disposed in at least a portion of interface between said drain electrode and said active channel layer, materials of said drain interfacial layer are selected to be the same organic semiconductor as said active channel layer and said drain interfacial layer contains a dopant for the reduction of contact resistance between said drain electrode and said active channel layer.

7. An organic thin film transistor with reduced contact resistance as defined in claim 1 wherein said source interfacial layer extends over said channel region, forming a continuous interfacial layer over the entire surface of said organic thin film transistor.

8. An organic thin film transistor with reduced contact resistance as defined in claim 1 wherein said active channel layer is deposited on said gate dielectric layer, said gate dielectric layer is deposited on said gate electrode, and said gate electrode is deposited on said substrate, forming a bottom gate organic semiconductor-based thin film transistor.

9. An organic thin film transistor with reduced contact resistance as defined in claim 1 wherein said potential barrier height between said source electrode and said active channel layer is reduced by doping said interfacial layer with $FeCl_3$.

10. An organic semiconductor-based thin film transistor with reduced contact resistance comprising:
   a substrate,
   a gate electrode,
   a gate dielectric layer overlapping at least a portion of said gate electrode,
   a drain electrode and a source electrode which are electrically isolated and define a channel region between them, said drain electrode overlaps a first portion of said gate electrode and gate dielectric layer, and source electrode overlaps a second portion of said gate electrode and gate dielectric layer, and
   an active channel layer deposited on said channel region and overlaps at least a part of said drain electrode and at least a part of said source electrode, said active channel layer contains a dopant for the reduction of series resistance between said source electrode and active channel layer and between said drain electrode and active channel layer, wherein the potential barrier height between said source elecrode and said active channel layer and between said drain electrode and said active channel layer is reduced.

11. An organic thin film transistor with reduced contact resistance as defined in claim 10 wherein said substrate is selected from a group comprising: glass substrates, glass substrates, plastic substrates, semiconductor substrates and metal foils having a dielectric layer.

12. An organic thin film transistor with reduced contact resistance as defined in claim 10 wherein said gate dielectric layer is selected from a group comprising: silicon oxide, silicon nitride, tantalum oxide, aluminum oxide and their mixtures.

13. An organic thin film transistor with reduced contact resistance as defined in claim 10 wherein materials of said active channel layers are selected from a group of small molecule organic semiconductors having molecular weights less than 1000 and large molecule organic semiconductors having molecular weights greater than 1000.

14. An organic thin film transistor with reduced contact resistance as defined in claim 10 wherein materials of said dopant is a group of organic materials and inorganic materials to effect a reduction of contact resistance between said source electrode and said active channel layer and a reduction of contact resistance between said drain electrode and said active channel layer.

15. An organic thin film transistor with reduced contact resistance as defined in claim 10 wherein said active channel layer is deposited on said gate dielectric layer, said gate dielectric layer is deposited on said gate electrode, and said gate electrode is deposited on said substrate, forming a bottom gate organic semiconductor-based thin film transistor.

16. An organic semiconductor-based thin film transistor with reduced contact resistance as defined in claim 10, wherein said dopant is $FeCl_3$.

* * * * *